(12) United States Patent
Lee

(10) Patent No.: US 12,422,907 B2
(45) Date of Patent: Sep. 23, 2025

(54) SEMICONDUCTOR PACKAGE AND THERMAL MANAGEMENT METHOD THEREOF

(71) Applicant: Samsung Electronics Co., Ltd., Suwon-si (KR)

(72) Inventor: Jungpil Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 385 days.

(21) Appl. No.: 17/879,089

(22) Filed: Aug. 2, 2022

(65) Prior Publication Data
US 2023/0121072 A1  Apr. 20, 2023

(30) Foreign Application Priority Data
Oct. 19, 2021 (KR) .......................... 10-2021-0138940

(51) Int. Cl.
| | |
|---|---|
| G06F 1/20 | (2006.01) |
| G06F 1/3206 | (2019.01) |
| G06F 1/3237 | (2019.01) |
| G06F 1/324 | (2019.01) |
| G06F 1/3287 | (2019.01) |

(Continued)

(52) U.S. Cl.
CPC ............ *G06F 1/206* (2013.01); *G06F 1/3206* (2013.01); *G06F 1/3237* (2013.01); *G06F 1/324* (2013.01); *G06F 1/3287* (2013.01); *H01L 23/34* (2013.01); *H01L 23/481* (2013.01); *H01L 25/0652* (2013.01); *H01L 25/0657* (2013.01); *H01L 24/16* (2013.01); *H01L 24/32* (2013.01); *H01L 24/73* (2013.01); *H01L 2224/16148* (2013.01); *H01L 2224/16227* (2013.01); *H01L 2224/16238* (2013.01); *H01L 2224/32225* (2013.01); *H01L 2224/73204* (2013.01); *H01L 2225/06513* (2013.01); *H01L 2225/06517* (2013.01); *H01L 2225/06524* (2013.01); *H01L 2225/06544* (2013.01); *H01L 2225/06589* (2013.01);

(Continued)

(58) Field of Classification Search
CPC ..................................................... G06F 1/206
See application file for complete search history.

(56) References Cited

U.S. PATENT DOCUMENTS

| | | |
|---|---|---|
| 8,724,415 B2 | 5/2014 | Kuroda |
| 8,801,279 B2 | 8/2014 | Kim et al. |

(Continued)

FOREIGN PATENT DOCUMENTS

| | | | | |
|---|---|---|---|---|
| JP | 2022084154 A | * | 6/2022 | ............... H03B 5/04 |
| KR | 10-2014-0085229 A | | 7/2014 | |

*Primary Examiner* — Phil K Nguyen
(74) *Attorney, Agent, or Firm* — Harness, Dickey & Pierce, P.L.C.

(57) ABSTRACT

Disclosed are semiconductor packages and thermal management methods thereof. The semiconductor package includes an upper semiconductor chip; and a lower semiconductor chip connected via a plurality of through electrodes to the upper semiconductor chip. The lower semiconductor chip may include at least one temperature sensor configured to sense a temperature of the upper semiconductor chip, a power control unit connected to the at least one temperature sensor, a power switching element connected to at least a first one of the plurality of through electrodes, and a clock control element connected to at least a second one of the plurality of through electrodes.

17 Claims, 9 Drawing Sheets

(51) Int. Cl.
   *H01L 23/34*   (2006.01)
   *H01L 23/48*   (2006.01)
   *H01L 25/065*  (2023.01)
   *H01L 23/00*   (2006.01)

(52) U.S. Cl.
   CPC ............... *H01L 2924/1426* (2013.01); *H01L 2924/1431* (2013.01); *H01L 2924/1436* (2013.01)

(56) References Cited

U.S. PATENT DOCUMENTS

| | | | |
|---|---|---|---|
| 9,041,475 B1 * | 5/2015 | Williams | H03L 1/02 |
| | | | 327/512 |
| 9,148,057 B2 | 9/2015 | Kim | |
| 9,287,196 B2 | 3/2016 | Saraswat et al. | |
| 9,342,443 B2 | 5/2016 | Walker et al. | |
| 9,368,479 B2 | 6/2016 | Katkar et al. | |
| 9,390,784 B2 | 7/2016 | Cho et al. | |
| 9,396,787 B2 * | 7/2016 | Shoemaker | G11C 5/025 |
| 9,570,147 B2 | 2/2017 | Kim | |
| 9,747,959 B2 | 8/2017 | Seo | |
| 10,199,085 B2 | 2/2019 | Nomura et al. | |
| 10,211,123 B2 | 2/2019 | Son | |
| 10,224,078 B2 | 3/2019 | Goto et al. | |
| 10,804,248 B2 | 10/2020 | Park | |
| 10,878,881 B1 | 12/2020 | Hsu et al. | |
| 2006/0290365 A1 * | 12/2006 | Riedlinger | G01R 31/2856 |
| | | | 714/E11.154 |
| 2009/0089792 A1 | 4/2009 | Johnson et al. | |
| 2009/0257164 A1 * | 10/2009 | Ikeuchi | G01K 7/01 |
| | | | 361/101 |
| 2012/0133427 A1 * | 5/2012 | Kim | H01L 25/16 |
| | | | 327/564 |
| 2013/0264610 A1 * | 10/2013 | Chen | H01L 23/345 |
| | | | 257/467 |
| 2015/0046729 A1 * | 2/2015 | Fukuoka | G06F 13/24 |
| | | | 713/320 |
| 2018/0005687 A1 * | 1/2018 | Kawabe | G11C 11/406 |
| 2019/0348389 A1 * | 11/2019 | Pancholi | H01L 24/11 |
| 2020/0043828 A1 * | 2/2020 | Smeys | H01L 23/315 |
| 2020/0161201 A1 * | 5/2020 | Park | H01L 23/3114 |
| 2020/0395088 A1 * | 12/2020 | Cho | G11C 11/5628 |
| 2021/0375830 A1 * | 12/2021 | Elsherbini | H01L 23/5389 |
| 2022/0166379 A1 * | 5/2022 | Itomi | H03H 9/1014 |

* cited by examiner

SEMICONDUCTOR PACKAGE AND THERMAL MANAGEMENT METHOD THEREOF

CROSS-REFERENCE TO RELATED APPLICATION

This U.S. nonprovisional application claims priority under 35 U.S.C § 119 to Korean Patent Application No. 10-2021-0138940 filed on Oct. 19, 2021 in the Korean Intellectual Property Office, the disclosure of which is hereby incorporated by reference in its entirety.

BACKGROUND

The present inventive concepts relate to a semiconductor package including stacked semiconductor chips and a thermal management method thereof.

In recent years, the use of electronic devices such as smart phones, tablet PCs, digital cameras, MP3 players, and personal digital assistants (PDAs) has rapidly increased. Such electronic devices necessitate a high-speed processor due to multimedia processing and an increase in throughput of various types of data, and various application programs are executed in the electronic devices.

The electronic devices include semiconductor devices such as working memories (e.g., DRAM), nonvolatile memories, and application processors (AP) to drive various application programs. With an increase in demand for high performance, e.g., at mobile environments, it is increasingly expected to increase integration and driving frequencies of the semiconductor devices.

A thermal management of an electronic device is extremely essential to improve an overall performance and to reduce power consumption of the electronic device. The thermal management may rely on an accurate measurement of temperature and a prompt appropriate control based on the measured temperature. In particular, an unintended abrupt variation in temperature may significantly affect the performance and reliability of compact-sized electronic devices. For example, a function is required to maintain a minimum operation mode even when external temperature is remarkably increased. Accordingly, a technique is needed to exactly measure temperatures of specific portions and to effectively control the temperature in electronic devices such as mobile devices.

SUMMARY

Some example embodiments of the present inventive concepts provide a semiconductor package with improved performance and reliability.

The object of the present inventive concepts is not limited to the mentioned above, and other objects which have not been mentioned above will be clearly understood to those skilled in the art from the following description.

According to some embodiments of the present inventive concepts, a semiconductor package may include an upper semiconductor chip; and a lower semiconductor chip connected via a plurality of through electrodes to the upper semiconductor chip. The lower semiconductor chip may include at least one temperature sensor configured to sense a temperature of the upper semiconductor chip, a power control unit connected to the at least one temperature sensor, a power switching element connected to at least a first one of the plurality of through electrodes, and a clock control element connected to at least a second one of the plurality of through electrodes.

According to some embodiments of the present inventive concepts, a semiconductor package may include a package substrate; a lower semiconductor chip on the package substrate; first and second upper semiconductor chips on the lower semiconductor chip and connected, via a plurality of through electrodes, to the lower semiconductor chip; and a molding layer on the package substrate and covering the lower semiconductor chip and the first and second upper semiconductor chips. The lower semiconductor chip may include a plurality of upper pads and a plurality of lower pads, a plurality of temperature sensors configured to sense temperatures of the first and second upper semiconductor chips, a power control unit connected to the temperature sensors, a power switching element connected to at least a first one of the plurality of through electrodes and to one of the plurality of upper pads, and a clock control element connected to at least a second one of the plurality of through electrodes and to another of the plurality of upper pads.

According to some embodiments of the present inventive concepts, a thermal management method of a semiconductor package including a lower semiconductor chip and an upper semiconductor chip connected, via a plurality of through electrodes, to the lower semiconductor chip. The method may comprise measuring, by a temperature sensor corresponding to the upper semiconductor chip, a temperature of the upper semiconductor chip; classifying, by the lower semiconductor, a power control based on the temperature measured at the temperature sensor; and based on the classification of the power control, interrupting a power provided to the upper semiconductor chip via a first one of the plurality of through electrodes or adjusting a period of a clock signal provided to the upper semiconductor chip via a second one of the plurality of through electrodes.

Details of some example embodiments are included in the description and drawings.

DETAIL PARTED DESCRIPTION OF EMBODIMENTS

Figure 1:
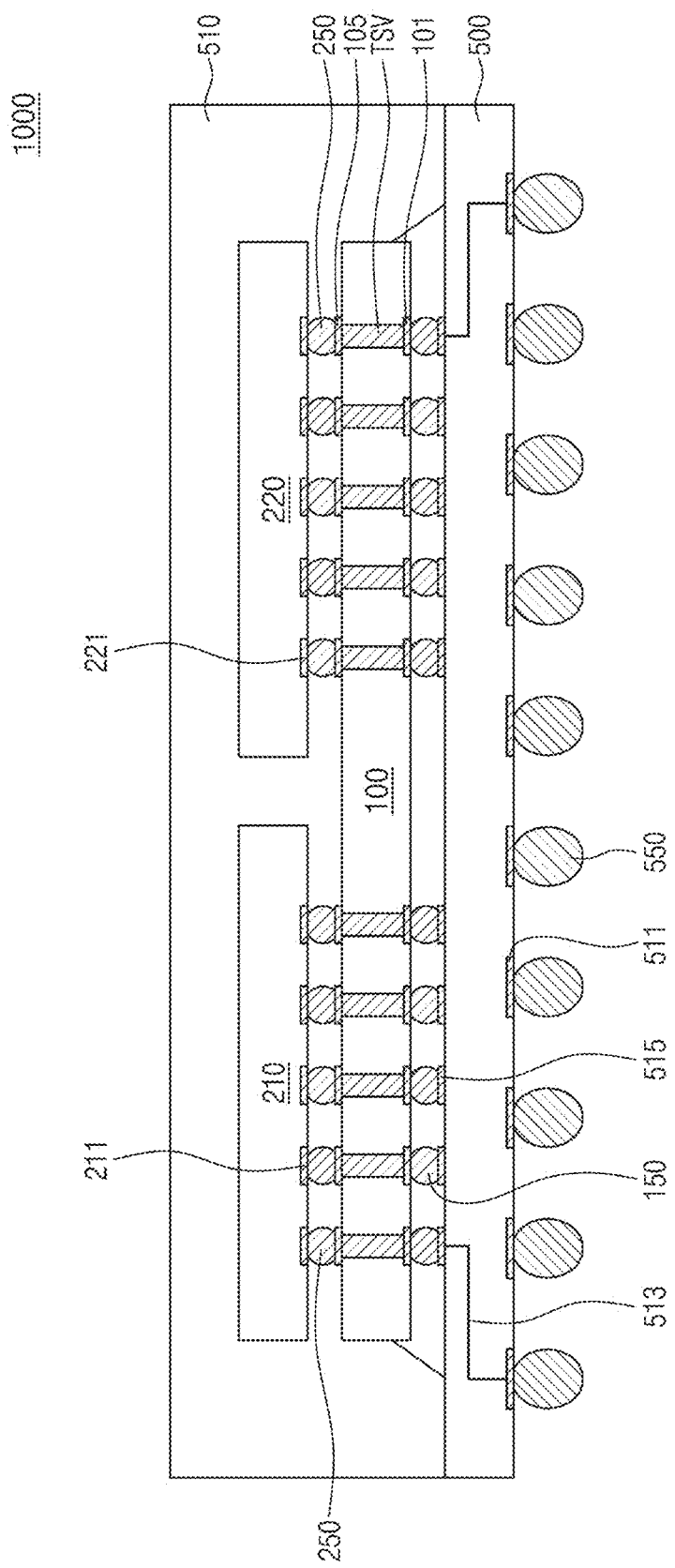
FIG. 1 illustrates a cross-sectional view showing a semiconductor package according to some embodiments of the present inventive concepts.

It will be hereinafter discussed a semiconductor package and a thermal management method thereof according to some example embodiments of the present inventive concepts in conjunction with the accompanying drawings. The thickness of layers, films, panels, regions, etc., may be exaggerated for clarity in the drawings, and like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 illustrates a cross-sectional view showing a semiconductor package according to some embodiments of the present inventive concepts.

Referring to FIG. 1, a semiconductor package 1000 may include a lower semiconductor chip 100, first and second upper semiconductor chips 210 and 220, a package substrate 500, and a molding layer 510.

The semiconductor package 1000 may have various intellectual property (IP) function blocks, such as central processing units (CPU) and/or graphics processing units (GPU), which are integrated thereon. For example, the semiconductor package 1000 may include semiconductor chips having various functions.

The lower semiconductor chip 100 may sense temperatures, e.g., when the first and second upper semiconductor chips 210 and 220 operate, and based on measured temperatures, may control whether power and clock signals are provided to the first and/or second upper semiconductor chips 210 and 220 via through electrodes TSV which will be discussed below.

The lower semiconductor chip 100 may include lower pads 101, upper pads 105, and through electrodes TSV that connect the lower pads 101 to the upper pads 105. The lower and upper pads 101 and 105 may include a power pad, a control signal pad, a data signal pad, a clock signal pad, and/or the like.

At least one of the first and second upper semiconductor chips 210 and 220 may be a flip-chip mounted on the lower semiconductor chip 100. In some embodiments, the first and second upper semiconductor chips 210 and 220 are stacked on the lower semiconductor chip 100, but the present inventive concepts are not limited thereto. For example, the lower semiconductor chip 100 may be provided thereon with four, six, eight, and/or more semiconductor chips.

In some embodiments, the first and second upper semiconductor chips 210 and 220 may respectively include chip pads 211 and 221. For the first and second upper semiconductor chips 210 and 220, the chip pads 211 and 221 may include a power pad, a control signal pad, a data signal pad, a clock signal pad, and/or the like. The chip pads 211 and 221 may, for example, correspond to at least one of the lower and/or upper pads 101 and 105. The chip pads 211 and 221 of the first and second upper semiconductor chips 210 and 220 may be connected through connection bumps 250 to the upper pads 105 of the lower semiconductor chip 100.

According to some embodiments, operating states of the first and second upper semiconductor chips 210 and 220 may be determined based on power and clock signals provided through the through electrodes TSV (e.g., from the lower semiconductor chip 100). For example, the power and clock signals provided to the first and second upper semiconductor chips 210 and 220 may be controlled based on operating temperatures of the first and second upper semiconductor chips 210 and 220.

The first and second upper semiconductor chips 210 and 220 may each be a logic chip including a processor (such as microelectromechanical system (MEMS) device, optoelectronic device, central processing unit (CPU), graphic processing unit (GPU), mobile application, or digital signal processor (DSP)), and/or the first and second upper semiconductor chips 210 and 220 may each be a memory chip (such as dynamic random access memory (DRAM), static random access memory (SRAM), NAND Flash memory, or resistive random access memory (RRAM)). In some example embodiments, one of the first and second upper semiconductor chips 210 and 220 may be a logic chip and the other a memory chip.

In some embodiments, the package substrate 500 may be a printed circuit board, a flexible substrate, and/or a tape substrate. For example, the package substrate 500 may be at least one of a flexible printed circuit board, a rigid printed circuit board, and/or a combination thereof.

For example, the package substrate 500 may have top and bottom surfaces that are opposite to each other, and may include lower bonding pads 511, upper bonding pads 515, and internal wiring lines 513. The internal wiring lines may be formed in the package substrate 500. The upper bonding pads 515 may be arranged on the top surface of the package substrate 500, and the lower bonding pads 511 may be arranged on the bottom surface of the package substrate 500. The upper bonding pads 515 may be electrically connected through the internal wiring lines 513 to the lower bonding pads 511.

The upper bonding pads 515 may be connected to the lower pads 101 of the lower semiconductor chip 100 through connection terminals 150. The connection terminals may be (and/or include) a conductive material, such as solder, and may be (and/or include) solder balls, solder pillars, and/or solder bumps.

The lower bonding pads 511 may be provided thereon with external bonding terminals 550 attached thereto. A ball grid array (BGA) may be provided as the external bonding terminals 550. The external bonding terminals 550 may be electrically connected through the lower bonding pads 511 and the internal wiring lines 513 *t* the upper bonding pads 515 of the package substrate 500. The external bonding terminals 550 may be used to connect the semiconductor package 1000 with an external device (not illustrated).

Figure 2:
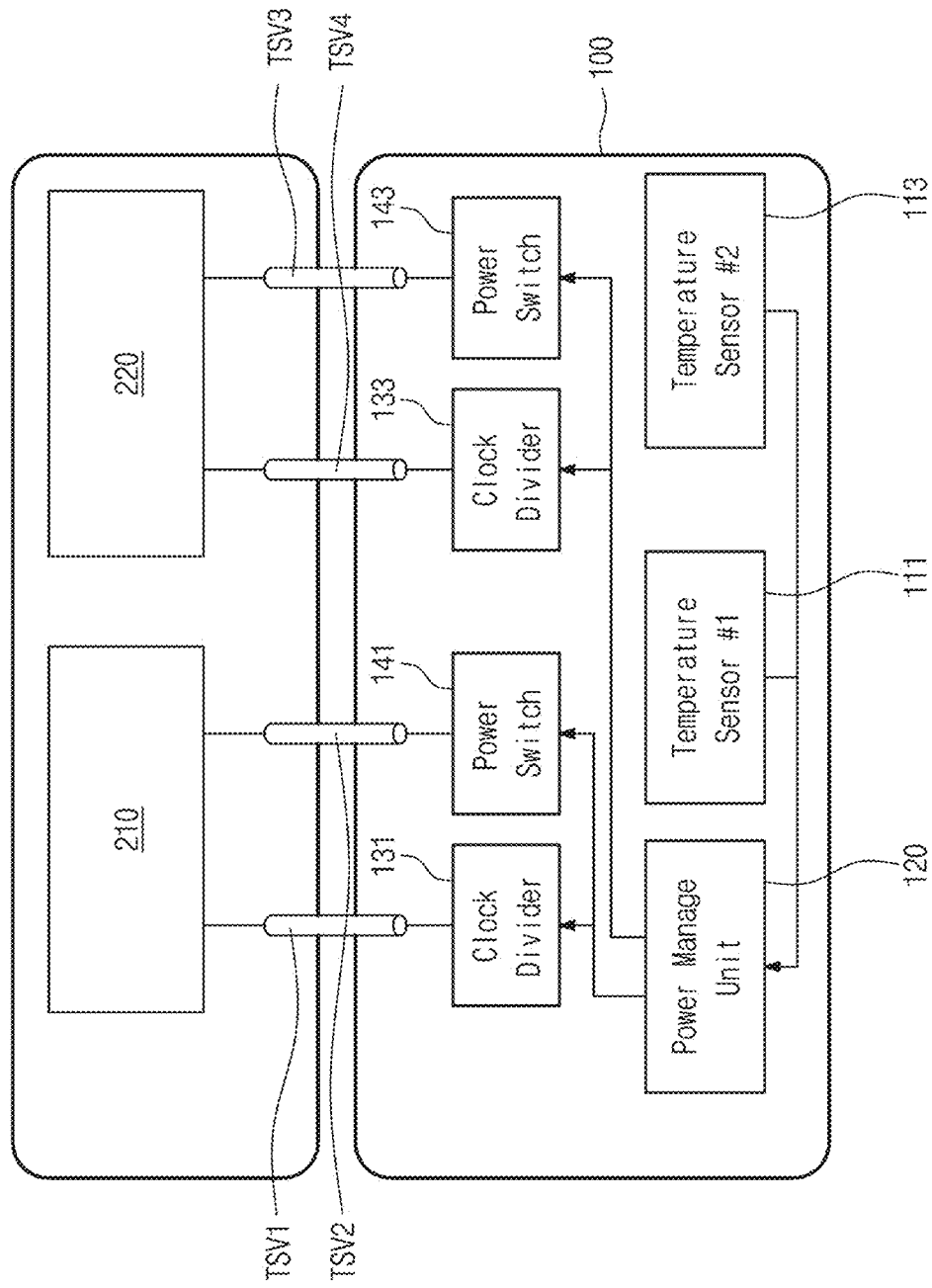
FIG. 2 illustrates a simplified block diagram showing a semiconductor package according to some embodiments of the present inventive concepts.
Figure 3:
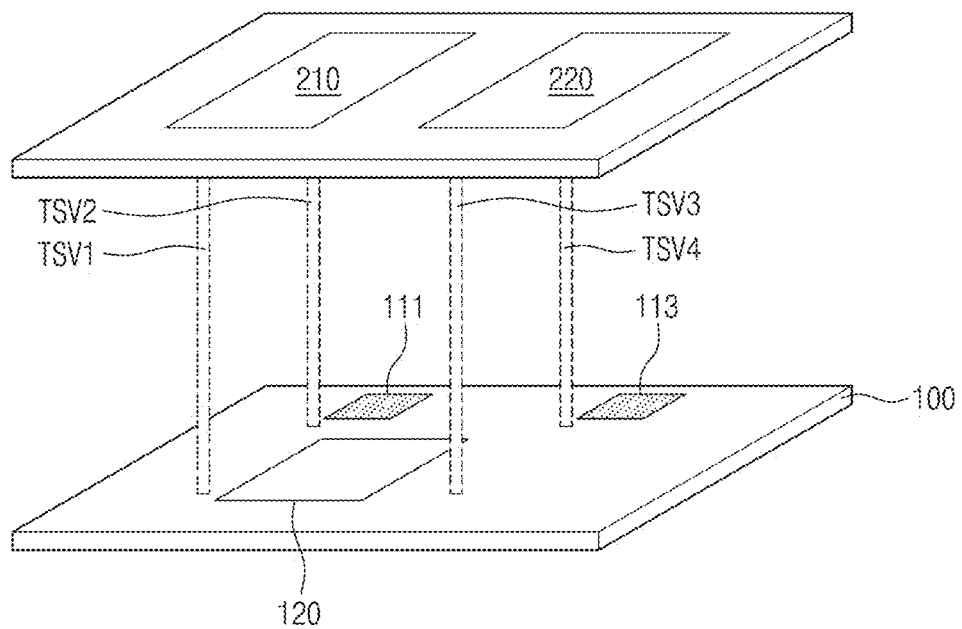
FIG. 3 illustrates a simplified perspective view showing a semiconductor package according to some embodiments of the present inventive concepts.

FIG. 2 illustrates a simplified block diagram showing a semiconductor package according to some embodiments of the present inventive concepts. FIG. 3 illustrates a simplified perspective view showing a semiconductor package according to some embodiments of the present inventive concepts.

Referring to FIGS. 2 and 3, the lower semiconductor chip 100 may include a plurality of temperature sensors 111 and 113, a power control unit 120, a plurality of clock control elements 131 and 133, a plurality of power switching elements 141 and 143, and a plurality of through electrodes TSV1, TSV2, TSV3, and TSV4.

The plurality of temperature sensors 111 and 113 may sense temperatures of the first and second upper semiconductor chips 210 and 220 (which are disposed on the lower semiconductor chip 100), and the power control unit 120 may receive temperature signals measured at the temperature sensors 111 and 113. The temperature sensors 111 and 113 may include, for example, a thermo-electromotive force (or thermo-electric couple) sensor that senses an electromotive force changed based on temperature or a pyro-conductivity sensor that senses a magnitude of resistance and/or resistance changed based on temperature. However, the temperature sensors 111 and 113 according to some embodiments are not limited thereto and may be variously changed.

In some embodiment, the plurality of temperature sensors 111 and 113 may include a first temperature sensor 111 that corresponds to the first upper semiconductor chip 210 and a second temperature sensor 113 that corresponds to the second upper semiconductor chip 220. As shown in FIG. 3, the first and second temperature sensors 111 and 113 may be disposed on the lower semiconductor chip 100 to vertically overlap the first and second upper semiconductor chips 210 and 220, respectively. Though only the first and second temperature sensors 111 and 113 are illustrated, for clarity, the embodiments are not limited thereto. For example, in some embodiments the number of the plurality of temperature sensors 111 and 113 may match the number of upper semiconductor chips 210 and 220. In some embodiments the number of the plurality of temperature sensors 111 and 113 may be greater than the number of upper semiconductor chips 210 and 220.

The power control unit 120 may be connected to the temperature sensors 111 and 113. The power control unit 120 may (e.g., through the connection) receive temperatures signals from the temperature sensors 111 and 113. Based on temperatures of the first and second upper semiconductor chips 210 and 220 measured at the temperature sensors 111 and 113, the power control unit 120 may control the power and clock signals provided to the first and second upper semiconductor chips 210 and 220. For example, based on the temperatures measured at the temperature sensors 111 and 113, the power control unit 120 may control electrical connections between the clock control elements 131 and 133, the power switching elements 141 and 143, and the through electrodes TSV1, TSV2, TSV3, and TSV4.

Thereby, the power control unit 120 may control operations of the first and/or second upper semiconductor chips 210 and 220 whose temperatures are increased. The power control unit 120 may compare temperature signals of the temperature sensors 111 and 113 with a reference temperature, and based on an increase in temperature and the degree of temperature increase, may interrupt a power provided to the first and second upper semiconductor chips 210 and 220 and/or may control the first and second upper semiconductor chips 210 and 220 to operate in idle modes, low power modes, and/or normal modes.

An operating state of each of the first and second upper semiconductor chips 210 and 220 may be classified into first, second, third, and fourth operating states based on a certain reference temperature. For example, the first operating state may be a state where a normal operation is impossible and/or detrimental, the second operating state may be a state where an idle state is maintained, the third operating state may be a state where an optimum performance is not achieved, and the fourth operating state may be a state where a normal performance is achieved.

When temperatures measured at the temperature sensors 111 and 113 are equal to or greater than about a first reference temperature (e.g., about 115° C.), the power control unit 120 may be configured to turn off the power switching elements 141 and 143. When temperatures measured at the temperature sensors 111 and 113 are equal to or greater than about a second reference temperature (e.g., about 95° C.) and less than the first reference temperature, the power control unit 120 may be configured to turn off the clock control elements 131 and 133 to interrupt clock signals that are provided through the clock control elements 131 and 133 to the first and second upper semiconductor chips 210 and 220.

When temperatures measured at the temperature sensors 111 and 113 are equal to or greater than about a third reference temperature (e.g., about 85° C.) and less than the second reference temperature, the power control unit 120 may be configured to adjust a period of clock that is output from the clock control elements 131 and 133.

Based on temperatures measured at the temperature sensors 111 and 113, the clock control elements 131 and 133 may adjust a period of clock that is provided to the first and second upper semiconductor chips 210 and 220. The clock control elements 131 and 133 may divide and/or interrupt clock signals provided to the first and second upper semiconductor chips 210 and 220, thereby controlling operations of the first and second upper semiconductor chips 210 and 220. The clock control elements 131 and 133 may be connected via the through electrodes TSV1 and TSV3 to the first and second upper semiconductor chips 210 and 220.

The power switching elements 141 and 143 may provide and/or interrupt powers provided to the first and second upper semiconductor chips 210 and 220. The power switching elements 141 and 143 may be connected via the through electrodes TSV1 and TSV3 to the first and second upper semiconductor chips 210 and 220.

The plurality of through electrodes TSV1, TSV2, TSV3, and TSV4 may include first and second through electrodes TSV1 and TSV2 that are connected to the first upper semiconductor chip 210, and may also include third and fourth through electrodes TSV3 and TSV4 that are connected to the second upper semiconductor chip 220.

Figure 4:
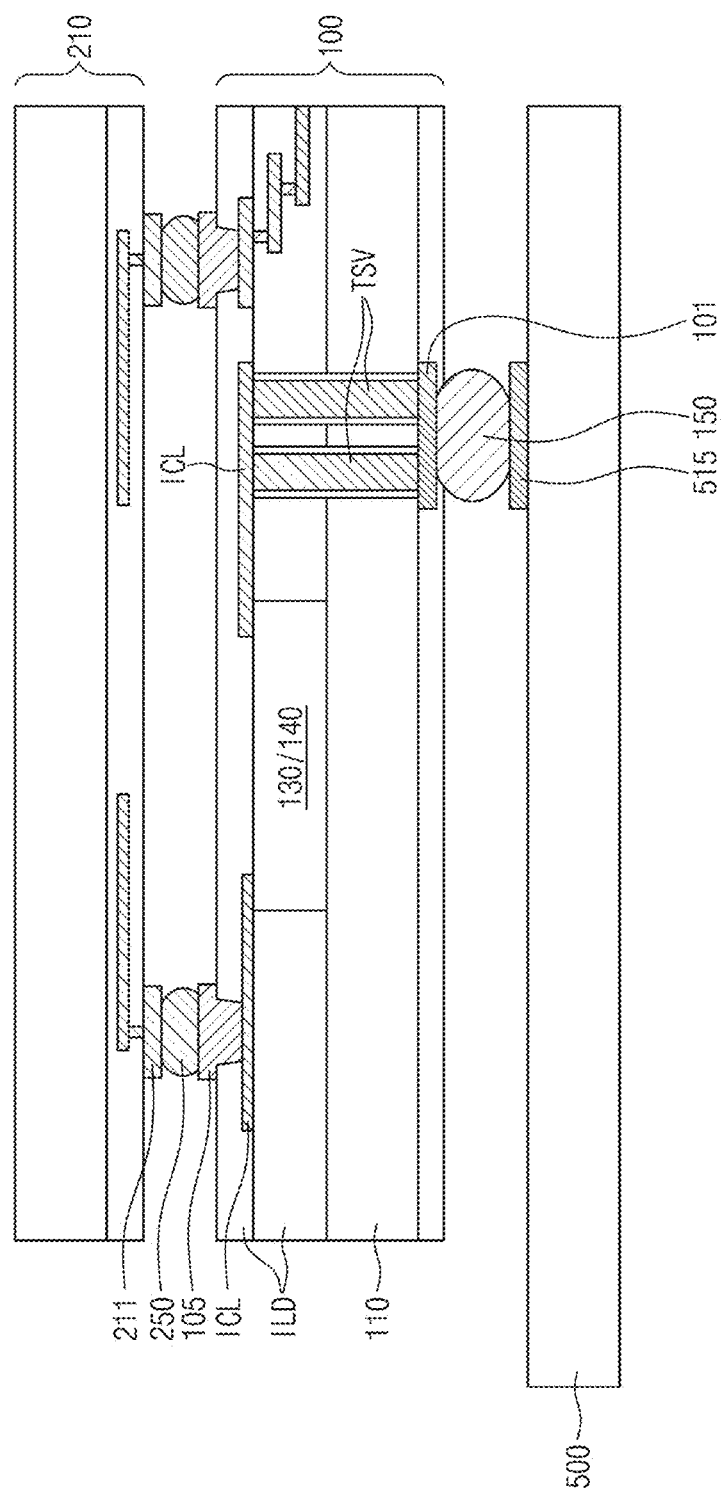
FIG. 4 illustrates an enlarged cross-sectional view showing a semiconductor package according to some embodiments of the present inventive concepts.

FIG. 4 illustrates an enlarged cross-sectional view showing a semiconductor package according to some embodiments of the present inventive concepts.

Referring to FIG. 4, the lower semiconductor chip 100 may include a clock control element 130 and a power switching element 140 that are formed on a semiconductor substrate 110. For simplicity, the cross-sectional view illustrates a functional block representing the clock control element 130 and/or a power switching element 140. Which of the clock control element 130 and/or a power switching element 140 is represented by the functional block may vary depending the position of the cross-section. The clock control element 130 and the power switching element 140 may, respectively, correspond to the clock control element 131 and the power switching elements 141 (as illustrated in FIG. 2).

The semiconductor substrate 110 may have a first surface and a second surface. The first surface and the second surface may be opposite to each other. The clock control element 130 and/or the power switching element 140 may be formed on the first surface of the semiconductor substrate 110. The lower pads 101 may be formed on the second surface of the semiconductor substrate 110, and may be connected through the connection terminals 150 to the upper bonding pads 515 of the package substrate 500. The lower pads 101 may be provided with power signals or clock signals from the package substrate 500.

Dielectric layers ILD may be provided on the first surface of the semiconductor substrate 110. The dielectric layers ILD may cover the clock control element 130 and/or the power switching element 140. The dielectric layers ILD may include wiring structures electrically connected to the clock control element 130 and/or the power switching element 140. The clock control element 130 and/or the power switching element 140 may be electrically connected between the through electrodes TSV and the upper pads 105 through the wiring structures.

Based on an operating temperature of an upper semiconductor chip measured at temperature sensors, the clock control element 130 may interrupt a clock signal and/or may change a period of clock signal provided to the upper semiconductor chip. For example, when a measured temperature is greater than a reference temperature, the clock signal may increase in period.

The dielectric layers ILD may be provided thereon with wiring patterns ICL. The wiring patterns ICL may be electrically connected to the through electrodes TSV and the lower and upper pads 101 and 105. The wiring patterns ICL may include, for example, a conductive material (such as at least one metal and/or its alloy). For example, the wiring patterns ICL may include at least one of tungsten (W), titanium (Ti), tantalum (Ta), copper (Cu), aluminum (Al), nickel (Ni), silver (Ag), gold (Au), platinum (Pt), tin (Sn), lead (Pb), chromium (Cr), palladium (Pd), indium (In), zinc (Zn), carbon (C), and/or a combination thereof.

The through electrodes TSV may penetrate the dielectric layers ILD and the semiconductor substrate 110 to be coupled to the metal wiring patterns ICL. The through electrodes TSV may each have a pillar shape, and may be spaced apart from the clock control element 130 and the power switching element 140. The through electrode TSV may include a barrier layer and a conductive (e.g., metal) layer. The barrier layer may include, for example, a double layer (and/or a mixture layer other than the double layer). The double (and/or mixture) layer may include titanium, titanium nitride, tantalum, tantalum nitride, ruthenium, cobalt, manganese, tungsten nitride, nickel, nickel boride, or titanium/titanium nitride. The barrier layer may reduce metal from diffusing from the through electrode TSV into the semiconductor substrate 110. The conductive layer may include, for example, a metal such as silver (Ag), gold (Au), aluminum (Al), tungsten (W), indium (In), and/or the like. A sidewall dielectric layer may surround a sidewall of each of the through electrodes TSV, and may be interposed between the semiconductor substrate 110 and the through electrodes TSV. For example, the sidewall dielectric layer may include silicon oxide, silicon oxynitride, silicon nitride, and/or a combination thereof.

Figure 5:
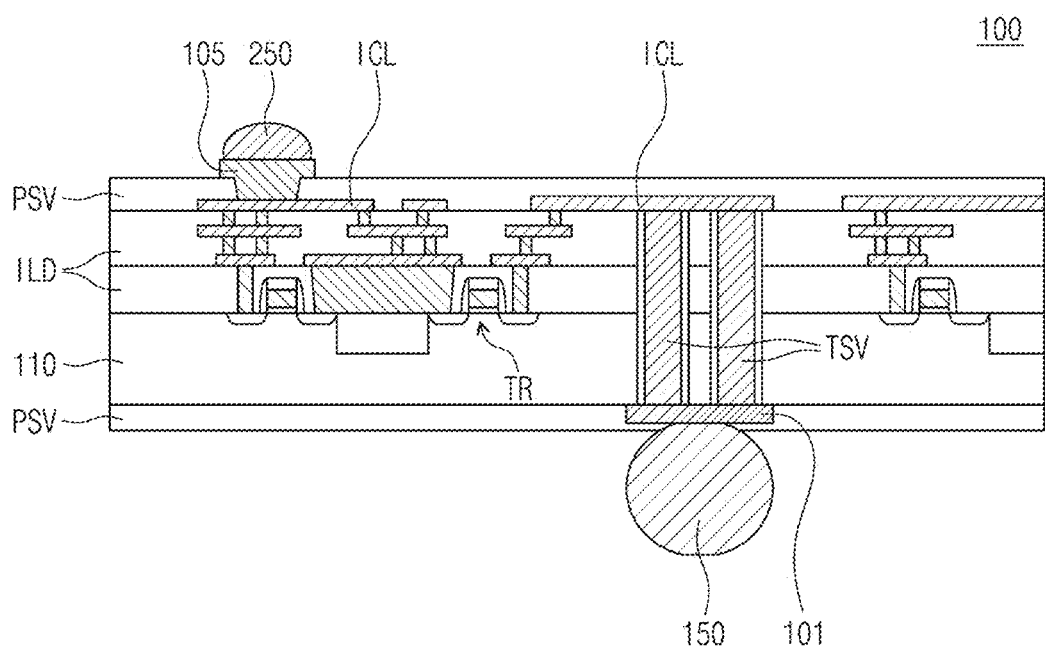
FIG. 5 illustrates an enlarged cross-sectional view partially showing a lower semiconductor chip of a semiconductor package according to some embodiments of the present inventive concepts.

FIG. 5 illustrates an enlarged cross-sectional view partially showing a lower semiconductor chip of a semiconductor package according to some embodiments of the present inventive concepts.

Referring to FIG. 5, the lower semiconductor chip 100 may include a semiconductor substrate 110, power and/or clock gating transistors TR integrated on the semiconductor substrate 110, and metal wiring patterns ICL connected to the power and/or clock gating transistors TR.

The semiconductor substrate 110 may be one of a semiconductor material (e.g., silicon wafer), a dielectric material (e.g., glass), a semiconductor covered with a dielectric material, and a conductor. For example, the semiconductor substrate 110 may be a silicon wafer having a first conductivity type.

The semiconductor substrate 110 may have a first surface and a second surface that are opposite to each other. The power and/or clock gating transistors TR may be formed on the first surface of the semiconductor substrate 110. The lower pads 101 may be formed on the second surface of the semiconductor substrate 110.

The power and/or clock gating transistors TR may include a gate electrode on the semiconductor substrate 110, a gate dielectric layer between the gate electrode and the semiconductor substrate 110, and source/drain impurity regions in the semiconductor substrate 110 on opposite sides of the gate electrode.

Herein, power gating transistors may be power gating switches to provide upper semiconductor chips with power. A first terminal of the power gating transistor may be connected to at least one of the upper pads 105, and a second terminal of the power gating transistor may be connected to at least one of the through electrodes TSV. The power gating transistor may be provided with a power voltage through the lower pad 101 and the through electrode TSV.

Herein, clock gating transistor may interrupt clock signals and/or adjust a period of clock signal provided to upper semiconductor chips. A first terminal of the clock gating transistor TR may be connected to at least one of the upper pads 105, and a second terminal of the clock gating transistor TR may be connected to at least one of the through electrodes TSV. The clock gating transistor TR may be provided with a clock signal through the lower pad 101 and the through electrode TSV. The clock gating transistor TR may increase a period of clock signal and/or may interrupt a clock signal.

In some embodiments, the power and/or clock gating transistors TR may be formed of PMOS or NMOS transistors.

The semiconductor substrate 110 may be provided on its first surface with dielectric layers ILD that cover the power and/or clock gating transistors TR, and passivation layers PSV may be provided on an uppermost dielectric layer ILD and the second surface of the semiconductor substrate 110. The passivation layers PSV may expose the lower pads 101 and the upper pads 105.

The through electrodes TSV may penetrate the dielectric layers ILD and the semiconductor substrate 110 to be coupled to the metal wiring patterns ICL. The metal wiring patterns ICL may electrically connect the through electrodes TSV to the second terminals of the power or clock gating transistors TR.

Figure 6:
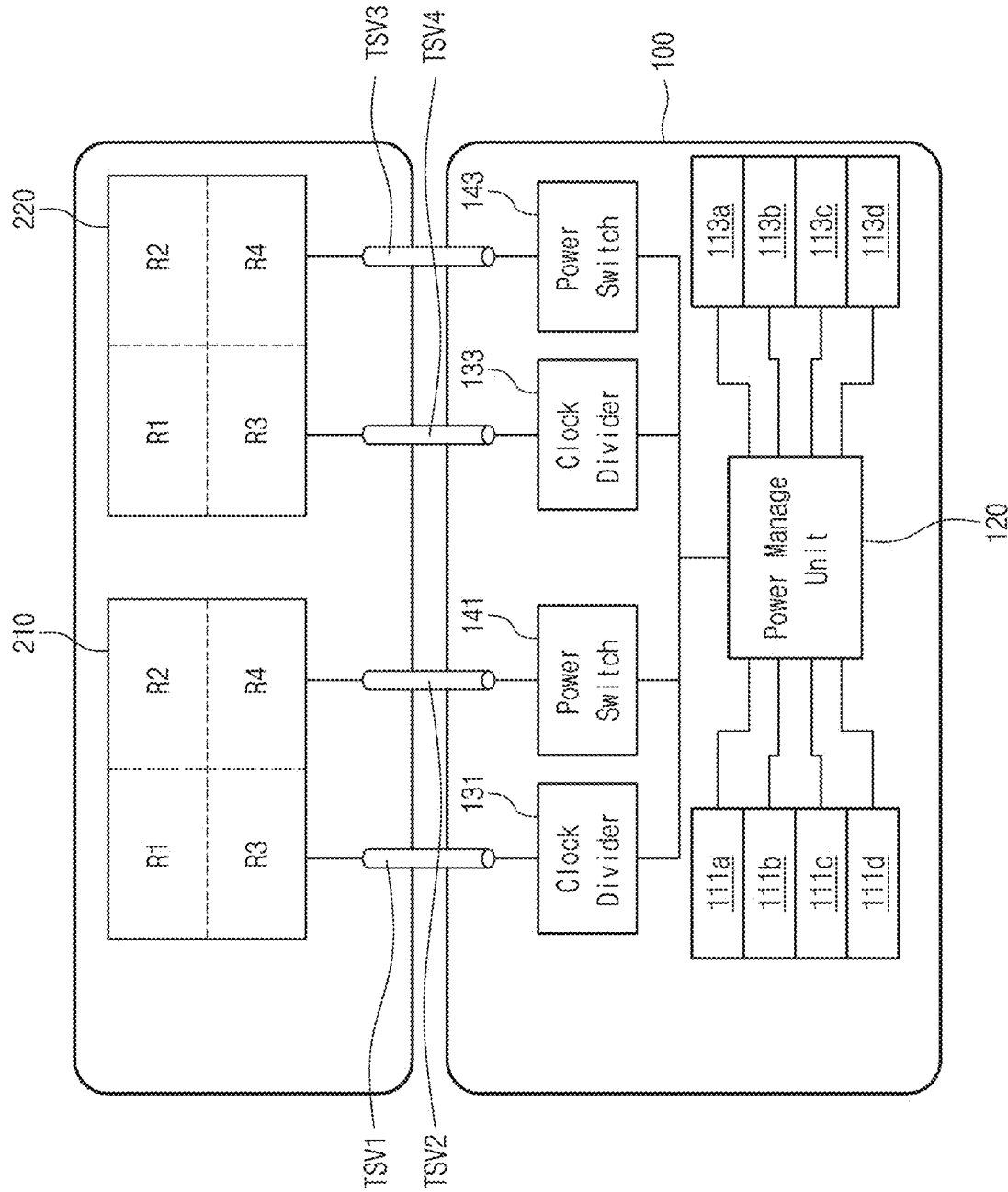
FIG. 6 illustrates a simplified block diagram showing a semiconductor package according to some embodiments of the present inventive concepts.
Figure 7:
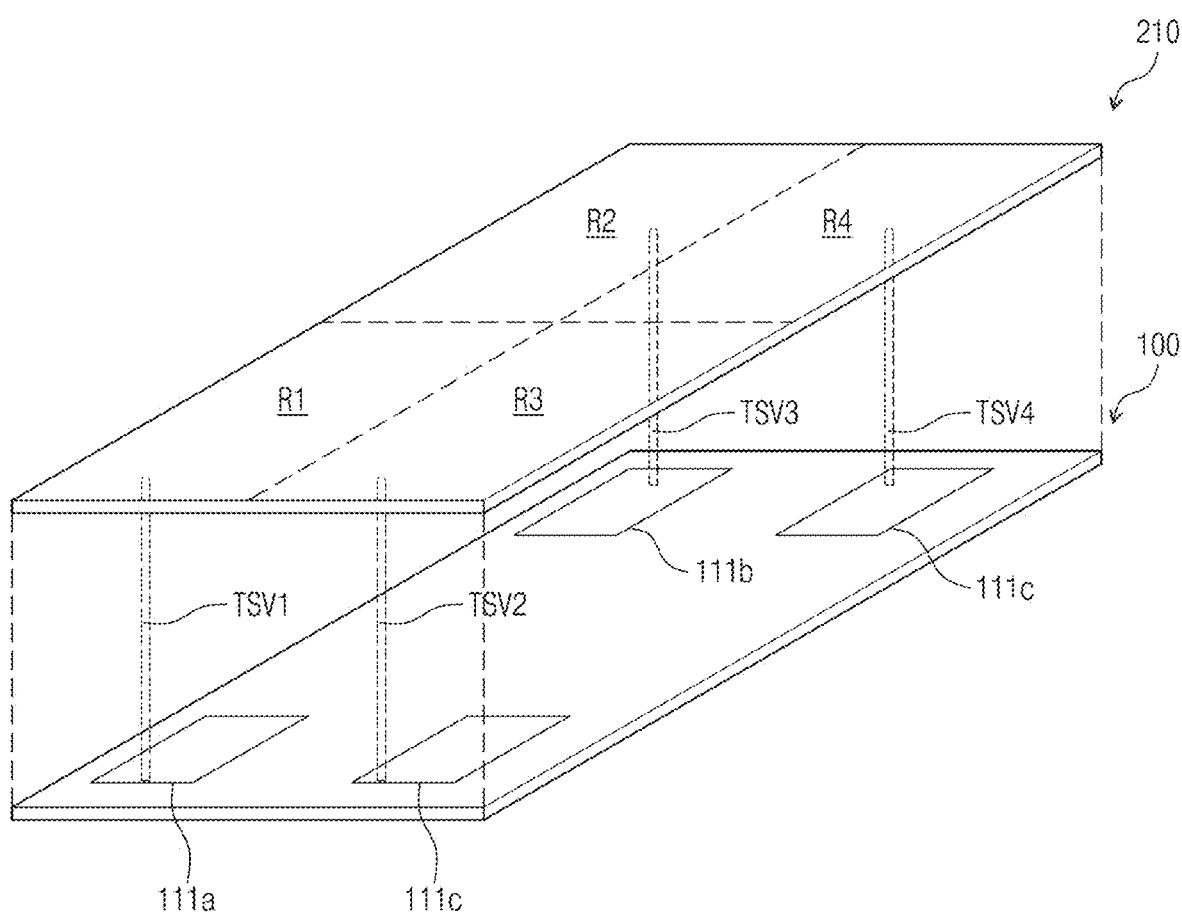
FIG. 7 illustrates a simplified perspective view showing a semiconductor package according to some embodiments of the present inventive concepts.

FIG. 6 illustrates a simplified block diagram showing a semiconductor package according to some embodiments of the present inventive concepts. FIG. 7 illustrates a simplified perspective view showing a semiconductor package according to some embodiments of the present inventive concepts. The same technical features as those of the embodiments discussed above may be omitted in the interest of brevity of description.

Referring to FIGS. 6 and 7, each of the first and second upper semiconductor chips 210 and 220 may include a plurality of regions R1, R2, R3, and R4. For example, each of the first and second upper semiconductor chips 210 and 220 may include first, second, third, and fourth regions R1, R2, R3, and R4.

The lower semiconductor chip 100 may have temperature sensors 111a to 111d and 113a to 113d that are disposed to correspond to the plurality of regions R1, R2, R3, and R4 of the first and second upper semiconductor chips 210 and 220. For example, first, second, third, and fourth temperature sensors 111a to 111d and 113a to 113d may vertically overlap the first, second, third, and fourth regions R1, R2, R3, and R4 of the first and second upper semiconductor chips 210 and 220. For example, the first temperature sensors 111a and 113a may be disposed to correspond to the first regions R1 of the first and second upper semiconductor chips 210 and 220, and the second temperature sensors 111b and 113b may be disposed to correspond to the second regions R2 of the first and second upper semiconductor chips 210 and 220. The third temperature sensors 111c and 113c may be disposed to correspond to the third regions R3 of the first and second upper semiconductor chips 210 and 220, and the fourth temperature sensors 111d and 113d may be disposed to correspond to the fourth regions R4 of the first and second upper semiconductor chips 210 and 220.

As the temperature sensors 111a to 111d and 113a to 113d are individually provided for the regions R1, R2, R3, and R4 of the first and second upper semiconductor chips 210 and 220, the temperature sensors 111a to 111d and 113a to 113d may detect specific areas of the first and second upper semiconductor chips 210 and 220, in which specific areas there are increased in operating temperatures.

Figure 8:
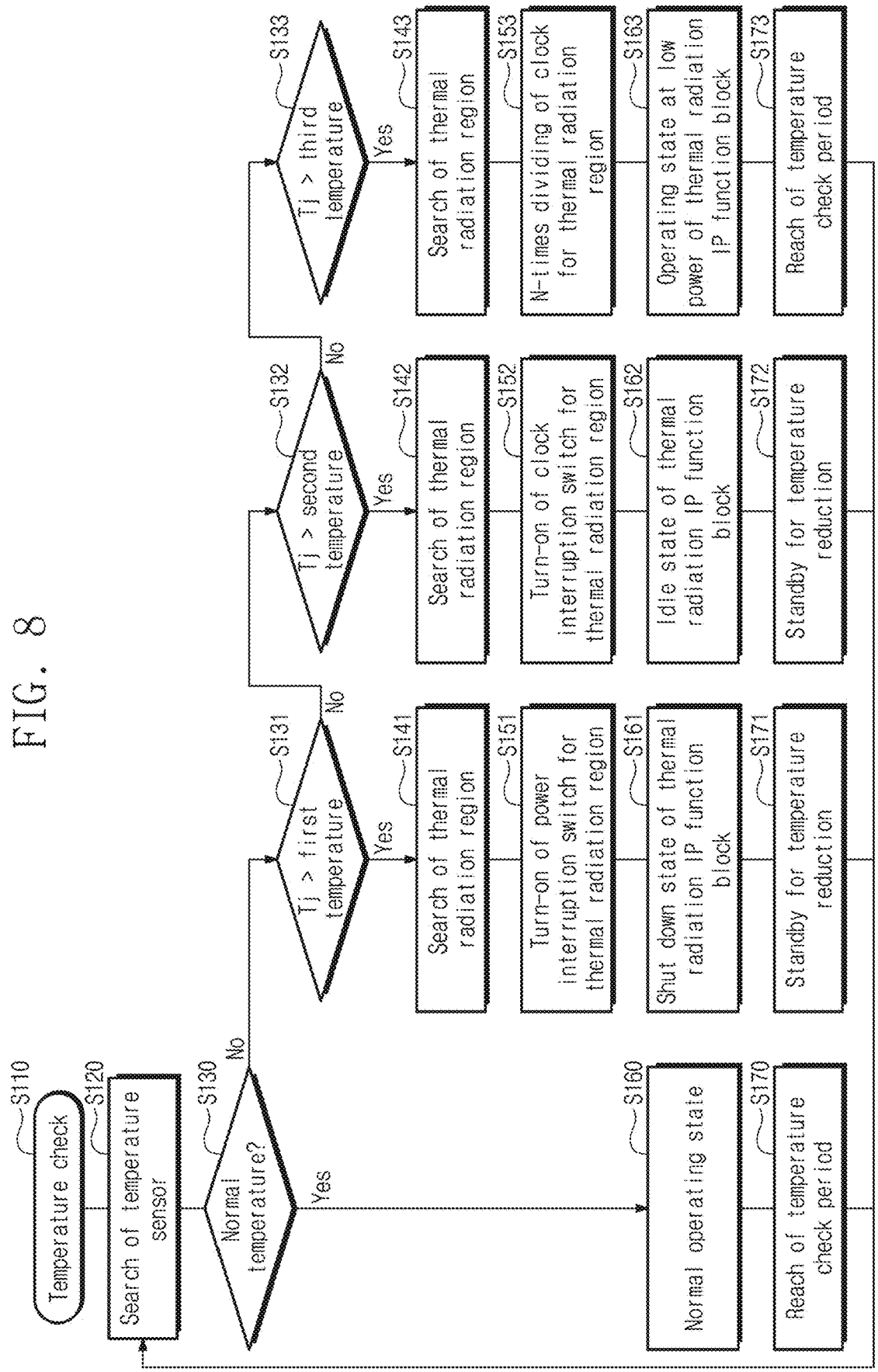
FIG. 8 illustrates a flow chart showing a thermal management method of a semiconductor package according to some embodiments of the present inventive concepts.

FIG. 8 illustrates a flow chart showing a thermal management method of a semiconductor package according to some embodiments of the present inventive concepts.

Referring to FIGS. 1, 2, and 8, when a semiconductor package operates, a temperature of the semiconductor package may be checked in real-time or periodically in order to control temperatures of upper semiconductor chips or first and second upper semiconductor chips (S110).

A state of the semiconductor package may be classified into a plurality of states (e.g., first, second, third, and/or fourth states) based on a certain criterion. For example, the first state may be a state where an operation (e.g., a normal operation) is impossible and/or detrimental, the second state may be a state where an idle state is maintained, the third state may be a state where an optimum performance is not achieved, and/or the fourth state may be a state where a normal performance is achieved.

The power control unit 120 may search the temperature sensors 111 and 113 of the package substrate (S120). The temperature sensors 111 and 113 may be searched such that the upper semiconductor chip under increased temperature may be controlled its temperature, and the upper semiconductor chip under normal temperature may be possible to operate. In some example embodiments, the search of the temperature sensors 111 and 113 may include determining a temperature at the temperature sensors 111 and 113 based on a temperature signal received from the temperature sensors 111 and 113 and/or requesting a temperature signal from the temperature sensors 111 and 113.

The results of the search of the temperature sensor S120 may be used to ascertain whether there are increased temperatures of the upper semiconductor chips (e.g., the first and second upper semiconductor chips) of the semiconductor package. For example, it may be determined whether a measurement temperature Tj sensed at a temperature sensor is a normal temperature or not (S130).

When the measurement temperature Tj is a normal temperature, the power control unit 120 may allow the upper semiconductor chip to maintain its normal operating state (S160). Afterwards, there may be maintained a standby state until a temperature check period is reached (S170). Then, the temperature-sensor search step may be performed again (S120).

When the measurement temperature Tj is equal to or greater than a normal temperature, based on the measurement temperature Tj, the power control unit 120 may control the clock control elements 131 and 133 and the power switching elements 141 and 143. The degree of power control may depend on the measurement temperature Tj.

For example, the power control unit 120 may determine whether the measurement temperature Tj is greater than a first reference temperature (e.g., about 115° C.) (pers). When the measurement temperature Tj is greater than the first reference temperature, the upper semiconductor chips may be controlled to reduce an operating temperature at one or more of the upper semiconductor chips and/or an operating temperature at a specific region of one or more of the upper semiconductor chips (S131). When the measurement temperature Tj is the same as or greater than the first reference temperature, a thermal radiation region may be searched (S141). Afterwards, the power switching elements 141 and 143 of the thermal radiation region may interrupt power supply to the thermal radiation region (S151). Then, there may occur a shut down state of the upper semiconductor chip under increased temperature or of a specific region of the upper semiconductor chip (S161). There may be maintained a standby state until a temperature of the thermal radiation region is reduced to a normal temperature (S171). After the temperature has returned to normal, the power switching elements 141 and 143 of the thermal radiation region may reinstate power to the thermal radiation region. After that, the temperature-sensor search step may be performed again (S120).

When the measurement temperature Tj is less than the first reference temperature, the power control unit 120 may determine whether or not the measurement temperature Tj is greater than a second reference temperature (e.g., about 95° C.) (S132). When the measurement temperature Tj is greater than the second reference temperature (and less than the first reference temperature), a thermal radiation region may be searched (S142). Afterwards, the clock control elements 131 and 133 of the thermal radiation region may interrupt the supply of clock signals to the thermal radiation region (S152). Then, there may occur an idle state of the upper semiconductor chip under increased temperature and/or of a specific region of the upper semiconductor chip (S162). After that, there may be maintained a standby state until a temperature of the thermal radiation region is reduced to a normal temperature (S172). After the temperature has returned to normal, the clock control elements of the thermal radiation region may reinstate power to the thermal radiation region. Then, the temperature-sensor search step may be performed again (S120).

When the measurement temperature Tj is less than the second reference temperature, the power control unit 120 may determine whether the measurement temperature Tj is greater than a third reference temperature (e.g., about 85° C.) (S133). When the measurement temperature Tj is greater than the third reference temperature (and less than the second reference temperature), a thermal radiation region may be searched (S143). The clock control elements 131 and 132 may divide a period of clock signal, and the divided clock signal may be provided to the upper semiconductor chip and/or the thermal radiation region (S153). Then, there may occur a state in which the upper semiconductor chip under increased temperature or the specific region is operated at a low power (S163). Afterwards, there may be maintained a standby state until a temperature of the thermal radiation region is reduced to a normal temperature (S173). After the temperature has returned to normal, the clock signal may be provided to the upper semiconductor chip and/or thermal radiation region. Then, the temperature-sensor search step may be performed again (S120).

A clock or power may be controlled based on measurement temperatures of upper semiconductor chips included in a semiconductor package, and thus it may be possible to limit an operation of a region or chip under increased temperature and to secure an operation of a region or chip under normal temperature. Consequently, the semiconductor package may improve in performance, reliability, and/or durability.

Figure 9:
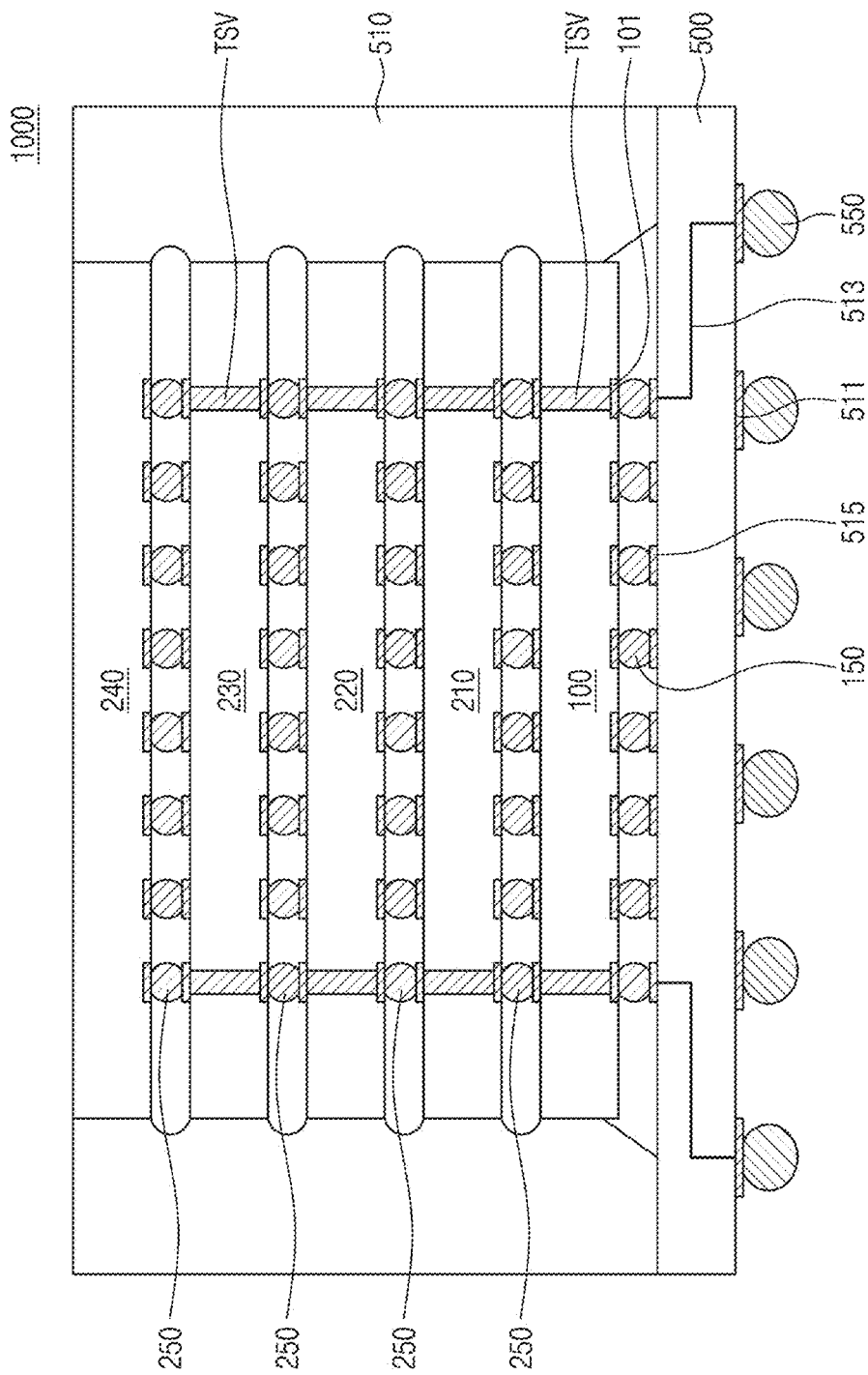
FIG. 9 illustrates a cross-sectional view showing a semiconductor package according to some embodiments of the present inventive concepts.

FIG. 9 illustrates a cross-sectional view showing a semiconductor package according to some embodiments of the present inventive concepts.

Referring to FIG. 9, a semiconductor package 1000 may include a package substrate 500, a lower semiconductor chip 100 mounted on the package substrate 500, and first, second, third, and fourth upper semiconductor chips 210, 220, 230, and 240 that are vertically stacked on the lower semiconductor chip 100.

The package substrate 500 may have top and bottom surfaces, and may include lower bonding pads 511, upper bonding pads 515, and internal wiring lines 513. The upper bonding pads 515 may be arranged on the top surface of the package substrate 500, and the lower bonding pads 511 may be arranged on the bottom surface of the package substrate 500. The upper bonding pads 515 may be electrically connected through the internal wiring lines 513 to the lower bonding pads 511. The lower bonding pads 511 may be attached thereon with external bonding terminals 550 such as solder balls or solder bumps.

The lower semiconductor chip 100 may be a flip-chip mounted on the package substrate 500. The lower semiconductor chip 100 may be a logic chip and/or a controller chip. The lower semiconductor chip 100 may include a plurality of through electrodes TSV, and the through electrodes TSV may be coupled to the package substrate 500 through connection terminals 150 such as solder bumps. The lower semiconductor chip 100 may be electrically connected via the through electrodes TSV to the first, second, third, and fourth upper semiconductor chips 210, 220, 230, and 240.

As discussed with reference to FIG. 2, the lower semiconductor chip 100 may include a plurality of temperature sensors 111 and 113, the power control unit 120, clock control elements 131 and 133, power switching elements 141 and 143, and through electrodes TSV. The temperature sensors 111 and 113 of the lower semiconductor chip 100 may sense operating temperatures of the first, second, third, and fourth upper semiconductor chips 210, 220, 230, and 240. Based on temperatures measured at the temperature sensors 111 and 113, the lower semiconductor chip 100 may control whether clock signals and power signals are provided via the through electrodes TSV to the first, second, third, and fourth upper semiconductor chips 210, 220, 230, and 240.

Each of the first, second, third, and fourth upper semiconductor chips 210, 220, 230, and 240 may include lower and upper pads (not designated by reference numerals) and a plurality of through electrodes TSV, and may be electrically connected through the through electrodes TSV to the lower semiconductor chip 100. The first, second, third, and fourth upper semiconductor chips 210, 220, 230, and 240 may be logic chips or memory chips.

The first, second, third, and fourth upper semiconductor chips 210, 220, 230, and 240 may be electrically connected through connection bumps 250.

An adhesion layer may be correspondingly provided between the lower semiconductor chip 100 and the first, second, third, and fourth upper semiconductor chips 210, 220, 230, and 240. The adhesion layer may be, for example, a polymer tape and/or a resin including a dielectric material. The adhesion layer may be interposed between the connection bumps 250, and may prevent the occurrence of electrical short between the connection bumps 250.

The package substrate 500 may be provided thereon with a molding layer 510 that covers sidewalls of the lower and upper semiconductor chips 100, 210, 220, 230, and 240. The molding layer 510 may have a top surface coplanar with that of the fourth upper semiconductor chip 240.

According to some embodiments of the present inventive concepts, a semiconductor package in which semiconductor chips are stacked may be configured to control clocks and powers provided via through electrodes, based on measurement temperatures of upper semiconductor chips. Therefore, it may be possible to limit an operation of the upper semiconductor chip or its region under increased temperature and to secure an operation of the upper semiconductor chip or its specific region under normal temperature. Consequently, the semiconductor package may improve in performance and reliability.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

What is claimed is:

1. A semiconductor package, comprising:
   a lower semiconductor chip including a plurality of through electrodes; and
   an upper semiconductor chip mounted to an upper surface of the lower semiconductor chip,
   wherein the lower semiconductor chip is electrically connected to the upper semiconductor chip via the plurality of through electrodes, and
   wherein the lower semiconductor chip includes
      at least one temperature sensor configured to sense a temperature of the upper semiconductor chip,
      a power control unit connected to the at least one temperature sensor,
      a power switching element connected to at least a first one of the plurality of through electrodes, and
      a clock control element connected to at least a second one of the plurality of through electrodes, and
   wherein the upper semiconductor chip includes a plurality of regions,
   the at least one temperature sensor includes a plurality of temperature sensors corresponding to the plurality of regions, and
   the plurality of temperature sensors vertically overlap the plurality of regions of the upper semiconductor chip, respectively.

2. The semiconductor package of claim 1, wherein the power control unit is configured to, based on a temperature sensed at the at least one temperature sensor, control a connection between the power switching element and the first one of the plurality of through electrodes and a connection between the clock control element and the second one of the plurality of through electrode.

3. The semiconductor package of claim 1, wherein, when a temperature measured at the at least one temperature sensor is equal to or greater than a first reference temperature, the power control unit is configured to turn off the power switching element.

4. The semiconductor package of claim 3, wherein the power control unit is configured to turn off the clock control element such that a clock signal provided through the clock control element to the upper semiconductor chip is interrupted when the temperature measured at the at least one temperature sensor is equal to or greater than a second reference temperature, wherein the second reference temperature is less than the first reference temperature.

5. The semiconductor package of claim 4, wherein the power control unit is configured to adjust a period of a clock signal that is output from the clock control element when the temperature measured at the at least one temperature sensor is equal to or greater than a third reference temperature, wherein the third reference temperature is less than the second reference temperature.

6. The semiconductor package of claim 1, wherein the power switching element is configured to control power supplied to the upper semiconductor chip.

7. The semiconductor package of claim 1, wherein the clock control element is configured to adjust a period of a clock signal provided to the upper semiconductor chip based on a temperature measured at the at least one temperature sensor.

8. The semiconductor package of claim 1, wherein the lower semiconductor chip includes:
a semiconductor substrate; and
a plurality of internal wiring lines, and
wherein the power switching element includes a power gating transistor on the semiconductor substrate and connected to at least one of the plurality of internal wiring elements, and the plurality of through electrodes penetrate the semiconductor substrate to connect with the plurality of internal wiring lines.

9. The semiconductor package of claim 1, wherein the lower semiconductor chip includes:
a semiconductor substrate;
a plurality of upper pads on the semiconductor substrate; and
a plurality of lower pads on the semiconductor substrate, and
wherein the power switching element includes a power gating transistor on the semiconductor substrate,
wherein a first terminal of the power gating transistor is connected to one of the plurality of upper pads, and
wherein a second terminal of the power gating transistor is connected to one of the plurality of through electrodes.

10. The semiconductor package of claim 1, wherein
the lower semiconductor chip includes a semiconductor substrate, a plurality of upper pads, and a plurality of lower pads, and
the plurality of through electrodes vertically penetrate the semiconductor substrate to be connected to the lower pads, and
at least one of the power switching element or the clock control element is connected to the upper pads.

11. A semiconductor package, comprising:
a package substrate;
a lower semiconductor chip on the package substrate;
first and second upper semiconductor chips mounted to an upper surface of the lower semiconductor chip and electrically connected to the lower semiconductor chip via a plurality of through electrodes; and
a molding layer on the package substrate and covering side surfaces of the lower semiconductor chip and side surfaces of the first and second upper semiconductor chips,
wherein the lower semiconductor chip includes
a semiconductor substrate,
a plurality of upper pads and a plurality of lower pads,
a plurality of temperature sensors configured to sense temperatures of the first and second upper semiconductor chips,
a power control unit connected to the temperature sensors,
a power switching element connected to at least a first one of the plurality of through electrodes and to one of the plurality of upper pads, and
a clock control element connected to at least a second one of the plurality of through electrodes and to another of the plurality of upper pads, and
wherein the power switching element includes a power gating transistor on the semiconductor substrate, and
wherein a first terminal of the power gating transistor is connected to the one of the plurality of upper pads and a second terminal of the power gating transistor is connected to the first one of the plurality of through electrodes.

12. The semiconductor package of claim 11, wherein the power control unit is configured to, based on a temperature measured at the temperature sensors, control an electrical connection between the power switching element and the first one of the plurality of through electrodes and between the clock control element and the second one of the plurality of through electrodes.

13. The semiconductor package of claim 11, wherein
the plurality of temperature sensors comprise a first temperature sensor corresponding to the first upper semiconductor chip and a second temperature sensor corresponding to the second upper semiconductor chip, and
the first and second temperature sensors vertically overlap the first and second upper semiconductor chips, respectively.

14. A thermal management method of a semiconductor package including a lower semiconductor chip and an upper semiconductor chip connected, via a plurality of through electrodes, to the lower semiconductor chip, the method comprising:
measuring, by a temperature sensor corresponding to the upper semiconductor chip, a temperature of the upper semiconductor chip;
classifying, by the lower semiconductor chip, a power control based on the temperature measured at the temperature sensor; and
based on the classification of the power control, interrupting a power provided to the upper semiconductor chip via a first one of the plurality of through electrodes or adjusting a period of a clock signal provided to the upper semiconductor chip via a second one of the plurality of through electrodes,
wherein the classifying the power control includes determining whether the measured temperature is equal to or greater at least one of a plurality of reference temperatures,
wherein the plurality of reference temperatures includes a first reference temperature and a second reference temperature less than the first reference temperature, and
when the measured temperature is equal to or greater than the second reference temperature and less than the first reference temperature, interrupting, by a power control unit, an electrical connection of a clock control element connected to the second one of the plurality of through electrodes.

15. The method of claim 14, wherein
when the measured temperature is equal to or greater than the first reference temperature, the interrupting the power provided to the upper semiconductor chip includes the power control unit interrupting an electrical connection between the first one of the plurality of through electrodes and a power terminal of the lower semiconductor chip.

16. The method of claim 14, wherein
the classifying the power control includes determining whether the measured temperature is equal to or greater than a third reference temperature, and
when the measured temperature is equal to or greater than the third reference temperature and less than the second reference temperature, the power control unit adjusts a period of a clock signal output from the clock control element connected to the second one of the plurality of through electrodes.

17. The method of claim 14, wherein
the temperature sensor is included in a plurality of temperature sensors,
each of the plurality of the temperature sensors is configured to individually sense temperatures of corresponding regions of the upper semiconductor chip, and
a clock period or a power for each of the regions of the upper semiconductor chip is controlled based on the classification of the power control.

* * * * *